US006966952B2

(12) United States Patent
Kim et al.

(10) Patent No.: US 6,966,952 B2
(45) Date of Patent: Nov. 22, 2005

(54) APPARATUS OF DEPOSITING THIN FILM WITH HIGH UNIFORMITY

(75) Inventors: Young-eal Kim, Gyeonggi-do (KR); Sang-jun Choi, Gyeonggi-do (KR); Dong-joon Ma, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/910,417

(22) Filed: Aug. 4, 2004

(65) Prior Publication Data

US 2005/0150461 A1 Jul. 14, 2005

(30) Foreign Application Priority Data

Jan. 8, 2004 (KR) ..................... 10-2004-0001103

(51) Int. Cl.[7] ............................................... C23C 14/00
(52) U.S. Cl. ........................ 118/726; 118/729; 118/730
(58) Field of Search ......................... 118/726, 729, 730

(56) References Cited

U.S. PATENT DOCUMENTS

| | | | | |
|---|---|---|---|---|
| 3,662,708 | A * | 5/1972 | Shrader | 118/730 |
| 3,889,632 | A * | 6/1975 | Brunner et al. | 118/730 |
| 2004/0035366 | A1 * | 2/2004 | Keum et al. | 118/726 |

FOREIGN PATENT DOCUMENTS

JP 2001-152336 * 6/2001

* cited by examiner

*Primary Examiner*—Richard Bueker
(74) *Attorney, Agent, or Firm*—Buchanan Ingersoll PC

(57) ABSTRACT

A deposition apparatus of depositing deposition material on a wafer in a vacuum chamber includes a deposition boat installed in the vacuum chamber to vaporize the deposition material, a wafer guide on which the wafer is loaded, the wafer guide having a rotational member rotating together with the wafer, a wafer-rotation device rotating the rotational member when the wafer guide approaches, and a wafer-transfer device reciprocating the wafer guide between an inlet of the vacuum chamber, the deposition boat and the wafer-rotation device.

23 Claims, 12 Drawing Sheets

APPARATUS OF DEPOSITING THIN FILM WITH HIGH UNIFORMITY

BACKGROUND OF THE INVENTION

This application claims the priority of Korean Patent Application No. 2004-1103, filed on Jan. 8, 2004, in the Korean Intellectual Property Office, the disclosure of which is incorporated herein in its entirety by reference.

FIELD OF THE INVENTION

The present invention relates to a deposition apparatus, and more particularly, to an apparatus of depositing a thin film with high uniformity, which is simplified in a structure to reduce the malfunctioning rate.

DESCRIPTION OF THE RELATED ART

In a sputtering method of forming a thin film on a wafer, a top surface area of a deposition boat must be twice that of the wafer to maintain the uniformity of the thin film above a predetermined level. This causes a size of a vacuum chamber to be increased.

In an electron-beam deposition method that can use a deposition boat that is smaller than that used for the sputtering method, since a distance between the deposition boat and the wafer must be enough long, the size problem of the vacuum chamber is not still solved.

To solve the above-described problems, a thermal deposition method using a resistance heating has been proposed. In the thermal deposition method, deposition material such as metal in a deposition boat is vaporized by electrical resistance heat to deposit the metal on the wafer disposed above the deposition boat. However, this method has problems that an enough distance between the deposition boat and the wafer is still required and density of the thin film is low.

FIG. 1 shows a conventional wafer-transfer device used in a deposition apparatus.

As shown in the drawing, the conventional wafer-transfer device 300 comprises a plurality of arms 310, 320 and 330 and a main control circuit 306 controlling the arms 310, 320 and 330. Each of the arms 310, 320 and 330 comprises a control circuit 316 (326, 336), an encoder 312 (322 and 332) and a driving motor 313 (323 and 333). The uppermost arm 330 is provided with a wafer guide 340 on which a wafer 214 is loaded. A motor 345 for rotating the wafer is mounted on the wafer guide 340. The arms 310, 320 and 330 are moved by the driving motors 313, 323 and 333 in accordance with the control of the control circuits 306, 316, 326, and 336, thereby displacing the wafer above a deposition boat.

However, when the deposition is performed using a deposition apparatus with the conventional wafer-transfer device, there is a problem of a regular maintenance for a band, a motor and a wiring as the wiring and driving devices are disposed between joints of each arm. Particularly, since the conventional wafer-transfer device 300 is exposed to vaporized metal, the metal may be deposited on the components, causing the malfunction of the wafer-transfer device 300 or increasing the defective rate.

In addition, as shown in FIG. 2A, the wafer 214 loaded on the wafer guide 340 is designed to be rotated alone by the motor 345. That is, the wafer guide 340 is not rotated, causing the wafer 214 to be separated during rotation as shown in FIG. 2B. The wafer guide 340 is therefore provided with sensors 341 and 342 for detecting the separation of the wafer 214. As shown in FIG. 2B, when the wafer 214 is separated from the wafer guide 340, the sensors 341 and 342 detects the separation so that the wafer loading operation can be repeated. However, this cannot solve the basic cause of the separation. That is, it is time-consuming to repeat the loading operation for the separated wafer on the wafer guide 340.

SUMMARY OF THE INVENTION

The present invention provides a deposition apparatus having a wafer-transfer device with a simple structure, thereby reducing the defective rate and saving the processing time.

Also, the present invention provides a deposition apparatus that can perform a high uniformity deposition.

In an aspect of the present invention, there is provided a deposition apparatus comprising: a deposition boat installed in the vacuum chamber to vaporize the deposition material; a wafer guide having a rotational member which is rotated together with the wafer; a wafer-rotation device rotating the rotational member when the wafer guide approaches; and a wafer-transfer device which reciprocates the wafer guide between an inlet of the vacuum chamber and the wafer-rotation device via the deposition boat.

The deposition apparatus of the present invention may further include a deposition barrier formed between the deposition boat and the wafer-transfer device vertically to prevent the deposition material from being deposited on the wafer-transfer device.

According to an embodiment of the present invention, the wafer-transfer device comprises a first driving motor installed on an external side of the vacuum chamber; and a transferring shaft rotated by the first driving motor, the transferring shaft being installed in the vacuum chamber in parallel with a direction where the wafer guide moves.

According to an embodiment of the present invention, the wafer guide comprises a housing provided with a central opening; a circumferential groove formed on an inner circumference of the central opening to receive the rotational member; an absorber for absorbing vibration incurred when the rotational member rotates; and a wafer guide support for fixing the wafer guide on the wafer-transfer device, wherein the rotational member is provided with a circular opening.

Preferably, the absorber comprises a plurality of holes formed on a bottom of the circumferential groove formed on the inner circumference of the housing; an absorbing spring inserted in each of the holes; and a ball disposed on the absorbing spring to contact the rotational member.

According to an embodiment of the present invention, the wafer-rotation device comprises a driver unit engaging with the rotational member of the wafer guide to rotate the wafer; and a docking absorber for attenuating impact incurred when the driver unit is engaged with the rotational member. Preferably, the driver unit comprises a driving shaft vertically installed on the bottom of the vacuum chamber; a driving gear formed around the driving shaft to rotate together with the driving shaft; a first driven gear engaged with the driving gear to rotate together with the driving gear; a driven shaft engaged with the first driven gear, the driven shaft having a lower end passing over a center of the first driven gear and extending near the bottom of the vacuum chamber; and a second driven gear coupled to an upper end of the driven shaft and engaged with the rotational member to rotate together with the rotational member.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
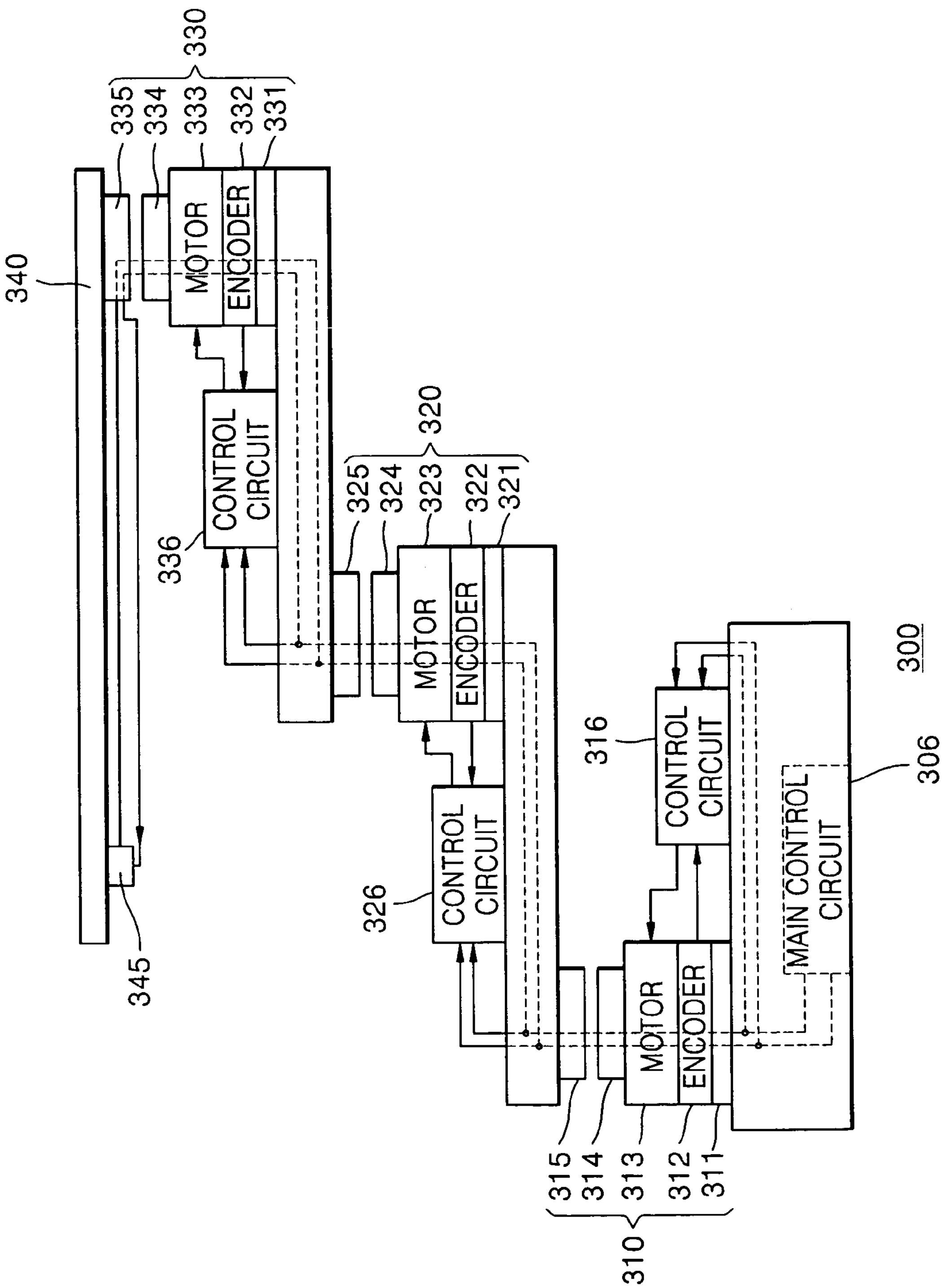
FIG. 1 is a view of a conventional wafer-transfer device used for a conventional deposition apparatus.
Figure 2A:
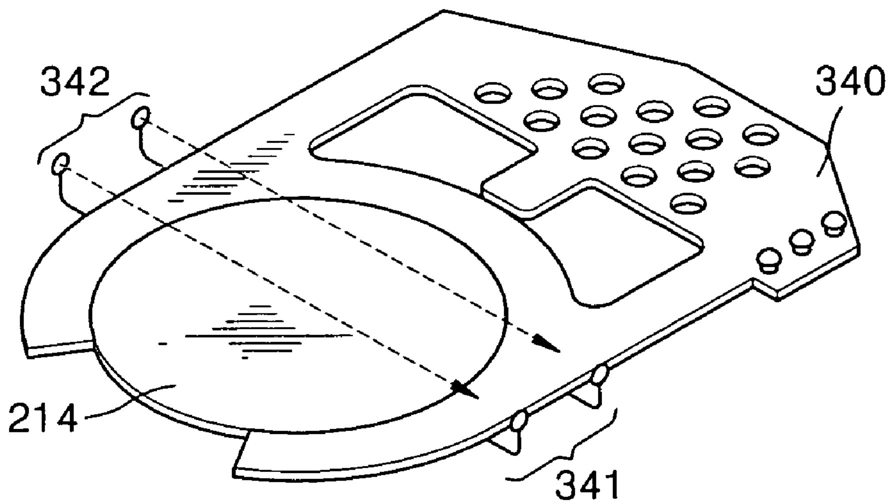
FIGS. 2A and 2B are views of a wafer guide of a conventional wafer-transfer device.
Figure 2B:
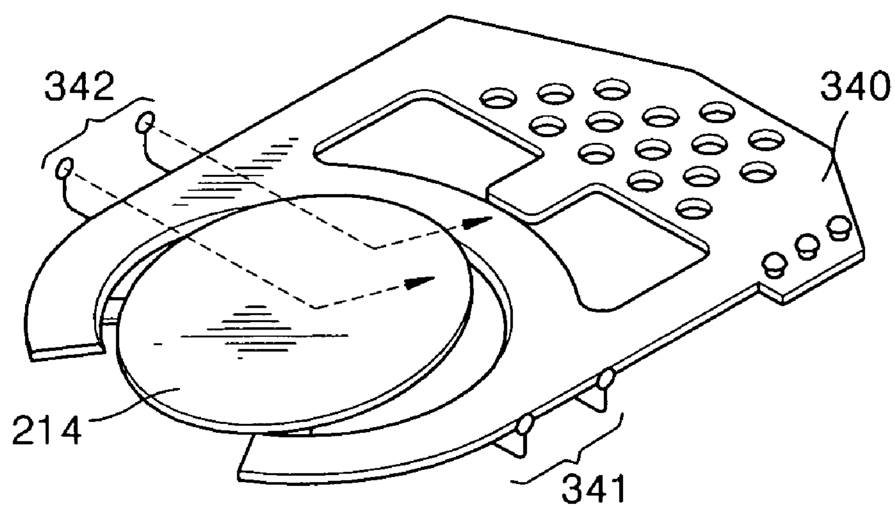
Figure 3A:
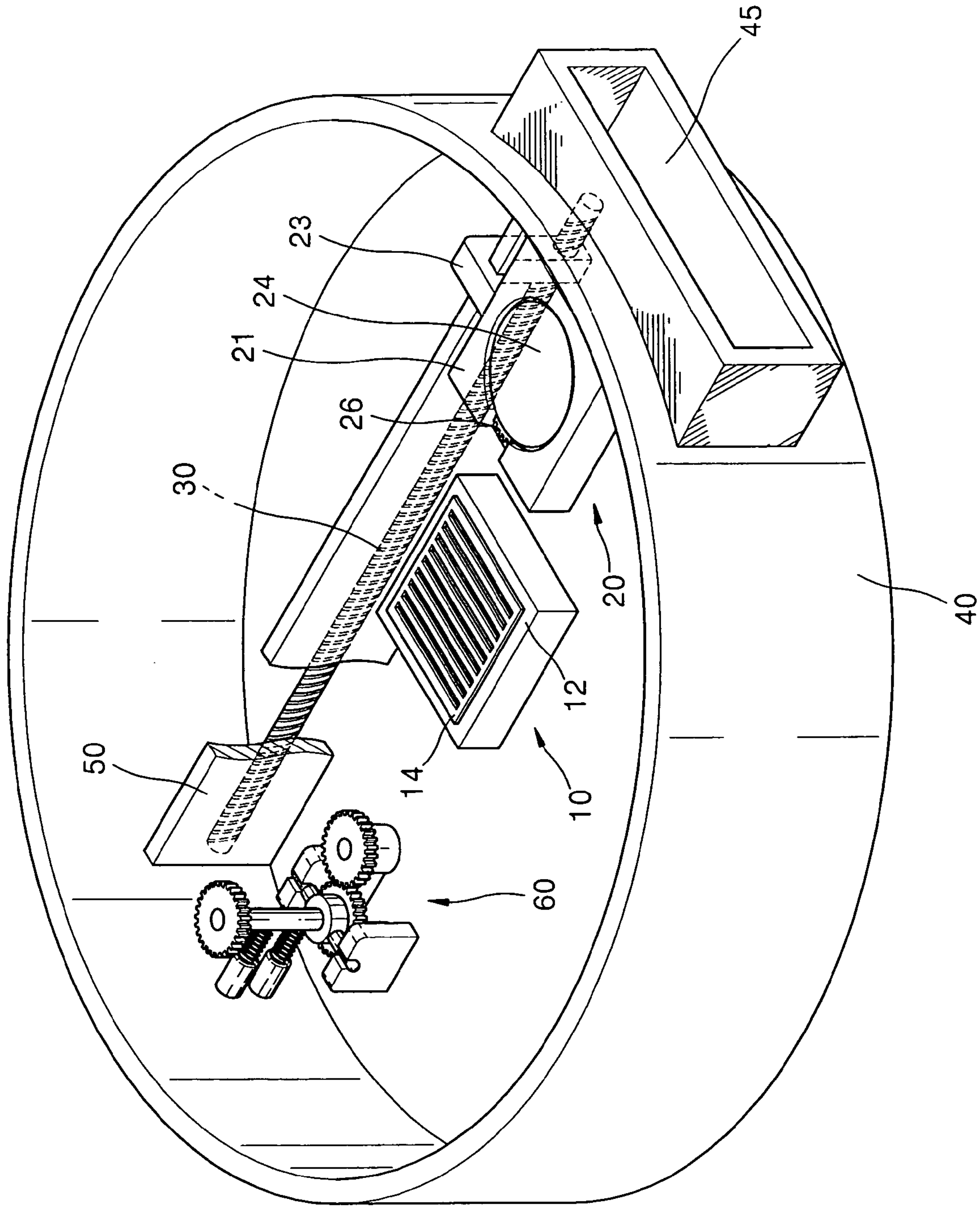
FIGS. 3A through 3C are views illustrating an operation of a deposition apparatus according to an embodiment of the present invention.
Figure 3B:
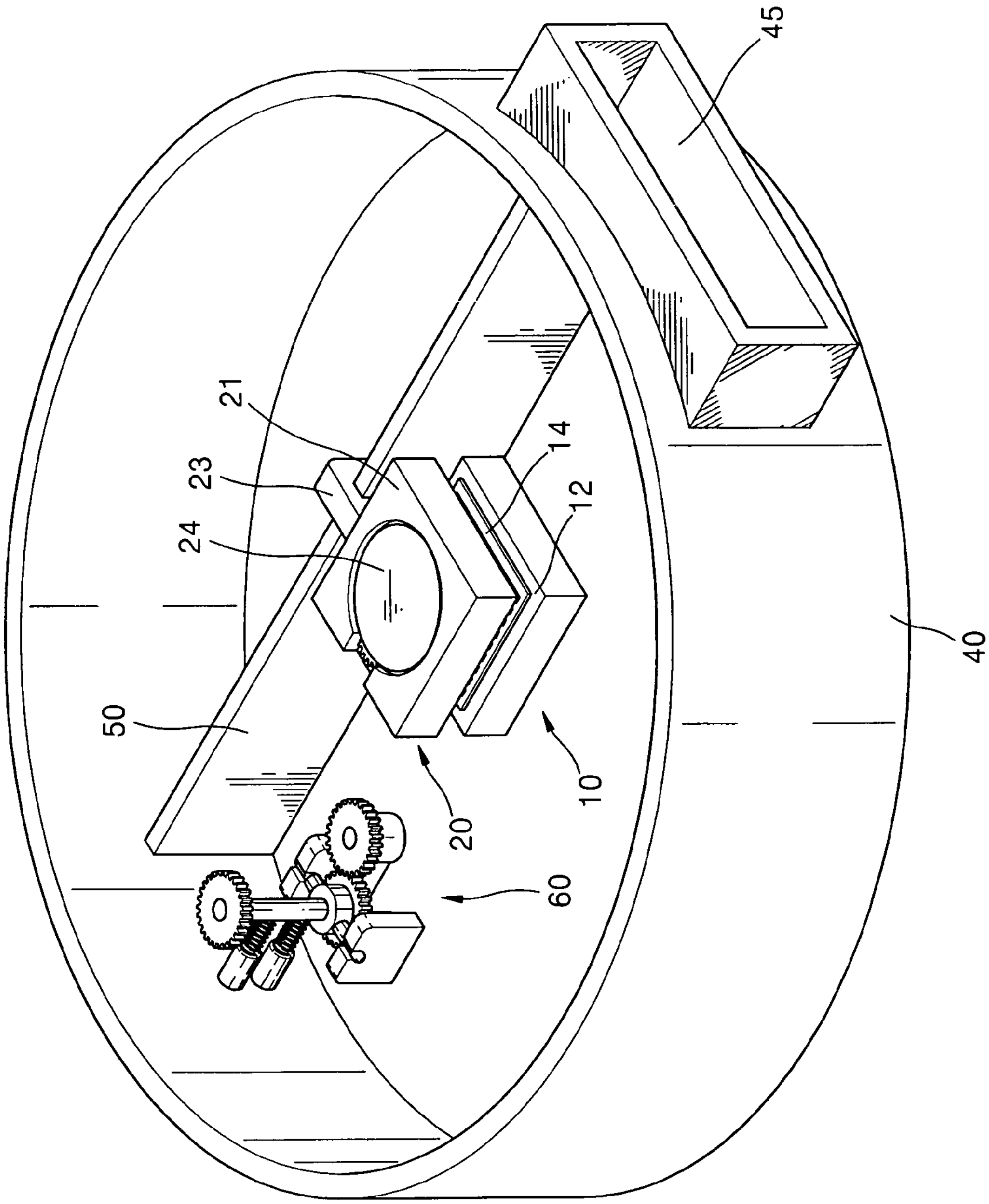
Figure 3C:
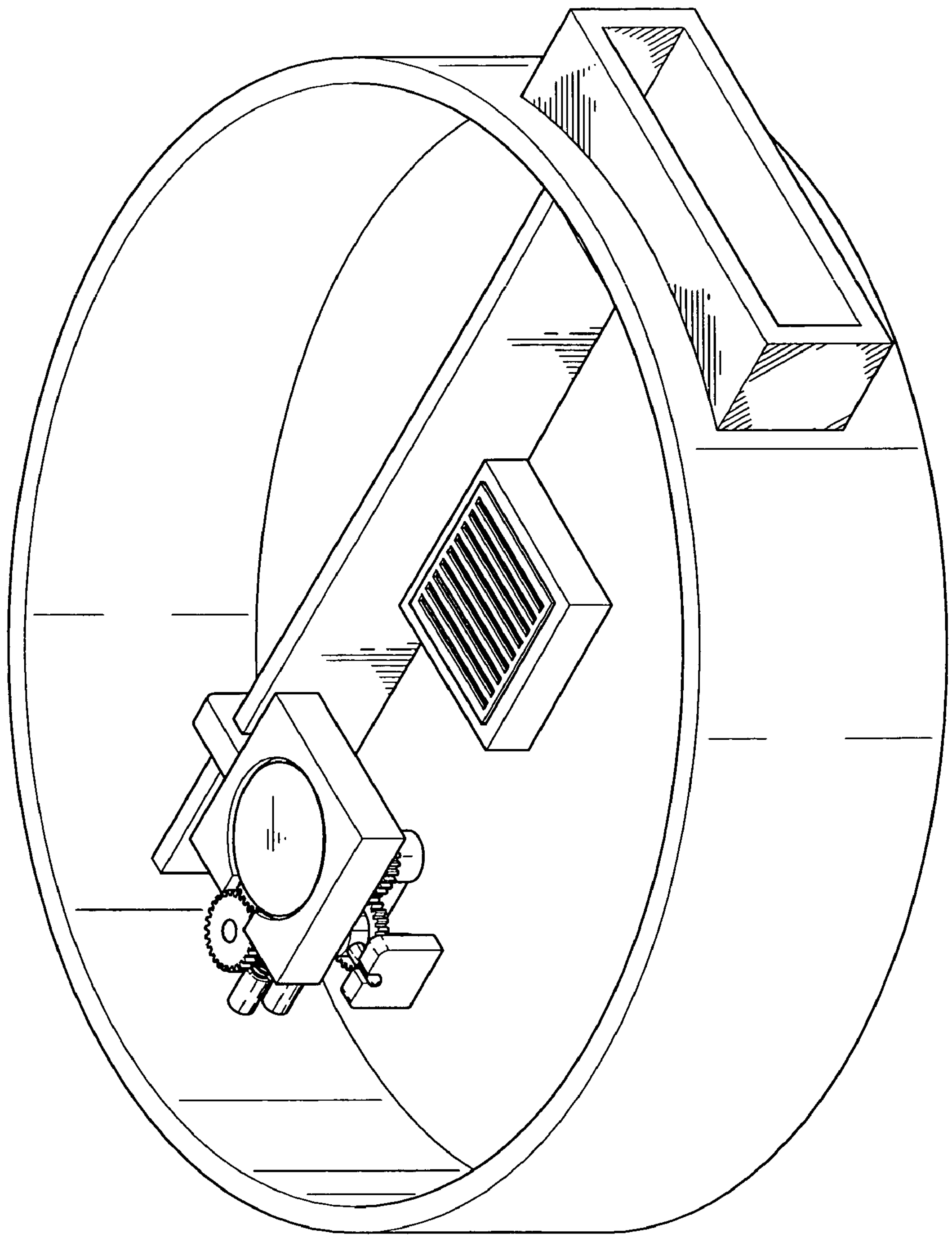

FIGS. 3A through 3C show an operation of a deposition apparatus according to an embodiment of the present invention.

As shown in the drawings, the inventive deposition apparatus comprises a deposition boat 10, a wafer guide 20, a wafer-transfer device 30, a deposition barrier 50, and a wafer-rotation device 60, all of which are disposed in a vacuum chamber 40.

Figure 4A:
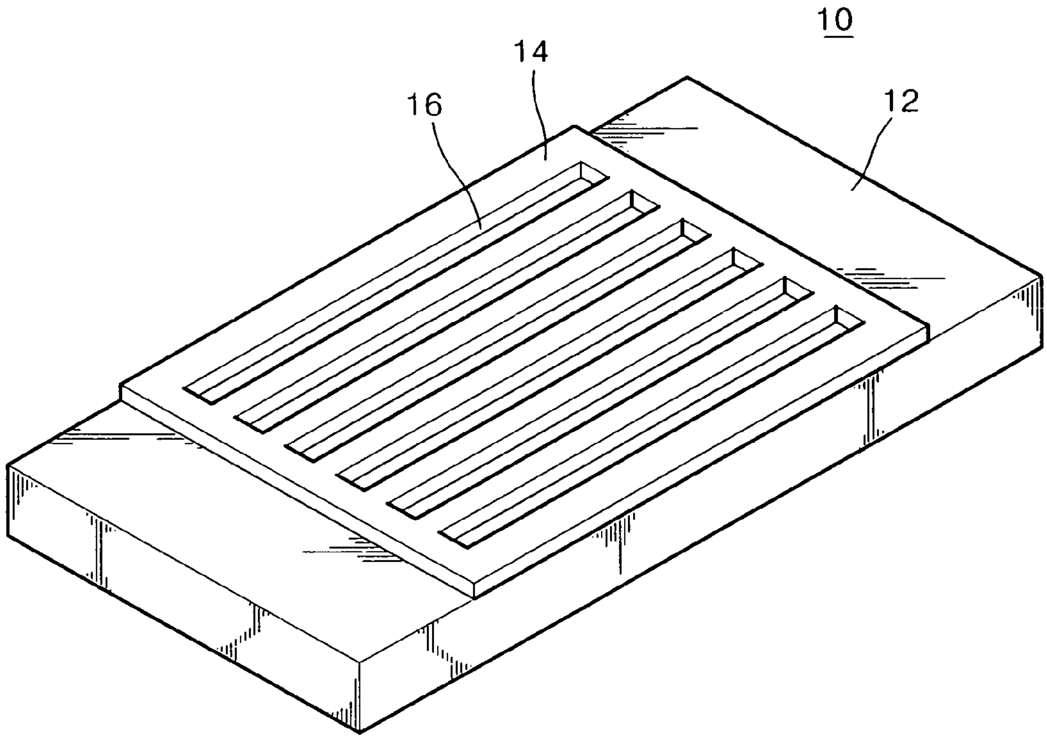
FIGS. 4A and 4B are respectively a perspective view and a sectional view illustrating a deposition boat according to an embodiment of the present invention.
Figure 4B:
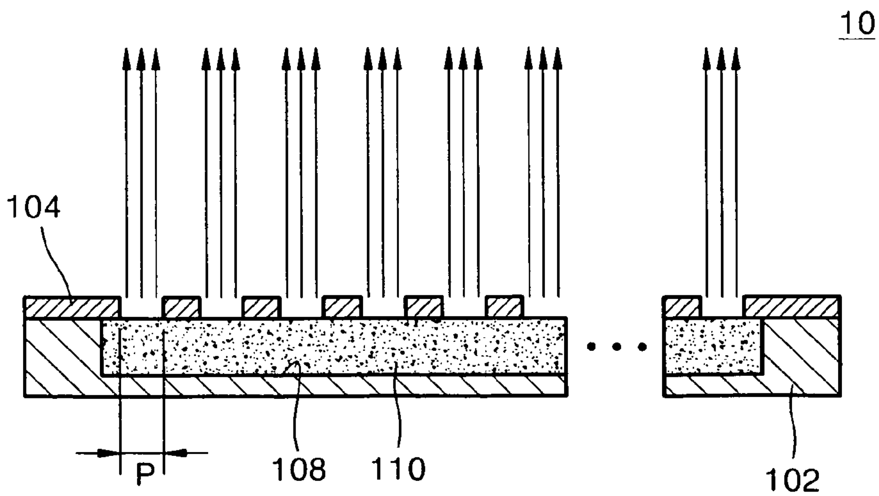
Figure 5:
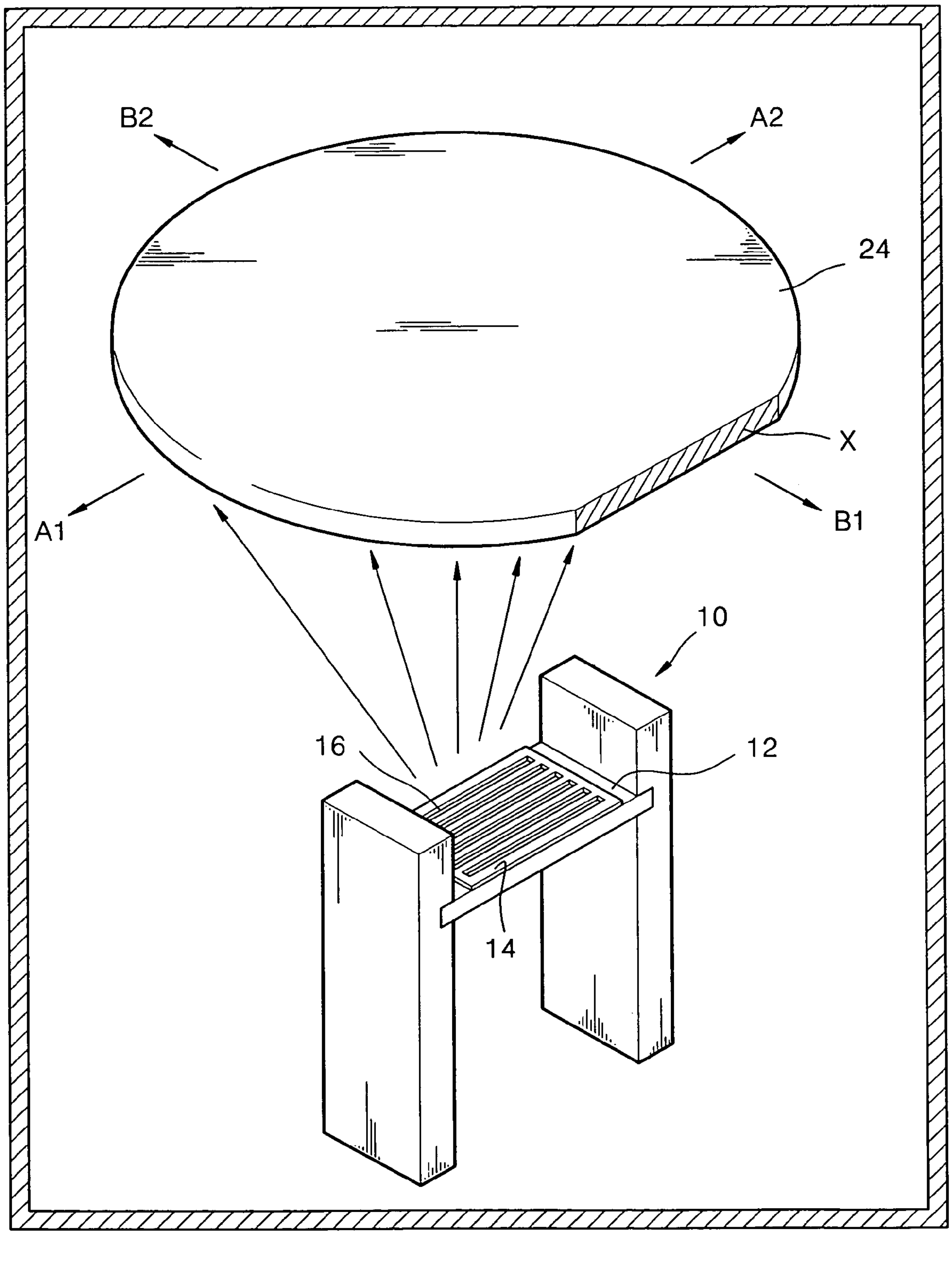
FIG. 5 is a view illustrating a deposition process according to an embodiment of the present invention.

To solve the problems of the above-described conventional deposition apparatus, as shown in FIGS. 4A and 4B, the deposition boat 10 comprises a boat body 12 provided at a center with a concave filling portion 18, a cover 14 provided with a plurality of slots 16 disposed in parallel with each other and a deposition material 19 filled in the concave filling portion 18. The deposition material 19 is vaporized in the deposition boat 10. The vaporized material 19 passes through the slots 16 of the cover 14, not being dispersed but advancing straight in a vertical direction. Therefore, a distance between the deposition boat 10 and the wafer can be significantly reduced, thereby reducing a size of the vacuum chamber of the deposition apparatus. At this point, to prevent the ununiform deposition of a thin film, which may be caused by the slots 16, as shown in FIG. 5, the deposition process is performed by firstly moving the wafer 24 in directions A1 and A2 above the deposition boat 10 in the deposition chamber 40, by rotating the wafer 24 by 90°, and by moving the wafer 24 in directions B1 and B2, thereby forming a very uniform thin film on the wafer.

A width P of the slot 16 may be in a range of 1–500 $\mu$m. As the deposition material vaporized in the deposition boat 10 passes through the parallel slots 16, the vaporized material is not dispersed but advanced straight. As a result, a distance between the deposition boat 10 and the wafer can be significantly reduced, thereby reducing the size of the vacuum chamber of the deposition apparatus.

Meanwhile, the wafer-transfer device 30 reciprocally moves the wafer guide 20 in a horizontal direction above the deposition boat 10 such that the vaporized material can be uniformly deposited on a lower surface of the wafer 24 disposed on the wafer guide 20. Therefore, the wafer-transfer device 30 may be simply designed to provide only a horizontal motion of the wafer guide 20 unlike a conventional wafer-transfer device that performs a complex motion with arms of complex structure.

Figure 6:
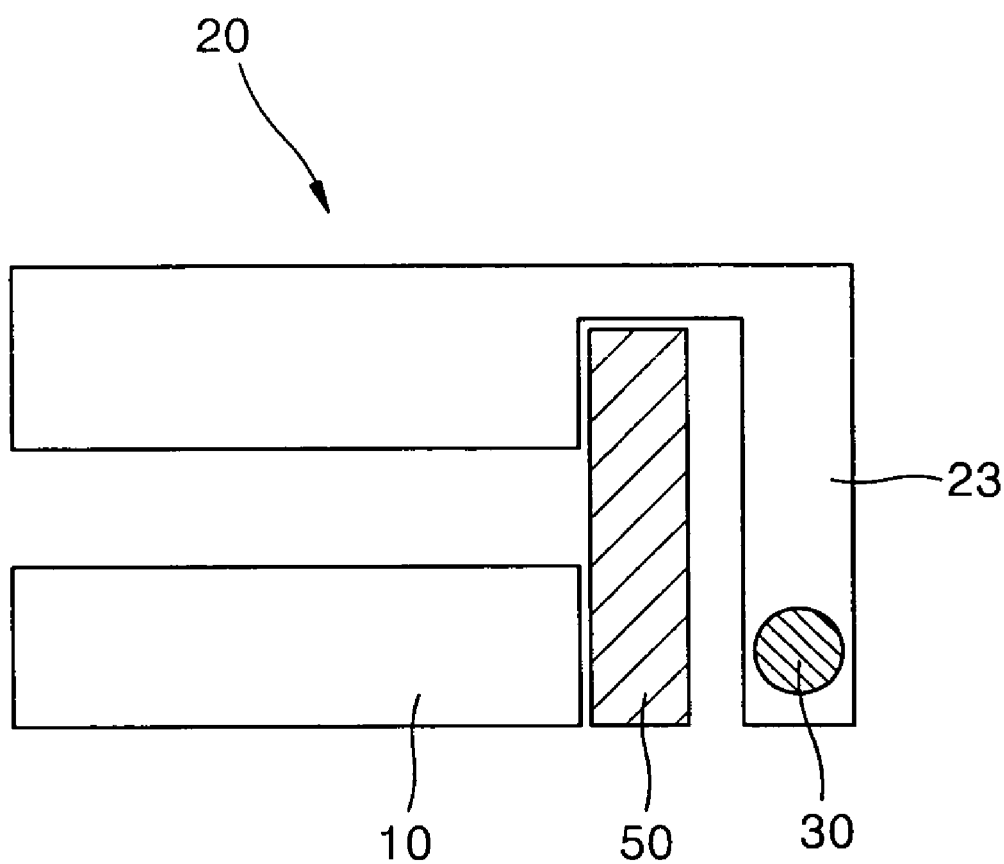
FIG. 6 is a sectional view of a wafer-transfer device of a deposition apparatus according to an embodiment of the present invention.

That is, the wafer-transfer device 30 may be formed of an actuator provided with a transferring shaft (i.e., a ball screw) rotated by a driving motor (not shown). That is, as shown in FIG. 3A, a longitudinal ball screw provided at an outer circumference with a thread is installed in the vacuum chamber 40. The ball screw has a first end fixed on a motor (not shown) disposed on an external side of the vacuum chamber 40 and a second end rotatably fixed on an inner wall of the vacuum chamber 40. As shown in FIG. 6, a ball nut is formed on a lower portion of a wafer guide support 23 for fixing the wafer guide 20 on the wafer-transfer device 30. The ball screw is coupled to the ball nut. As a result, whenever the ball screw rotates clockwise or counterclockwise, the wafer guide 20 moves frontward and rearward along the screw thread. At this point, a rail (not shown) may be installed between a bottom of the vacuum chamber 40 and the wafer guide support 23 to allow the wafer guide 20 to move without being swayed.

Alternatively, the wafer-transfer device 30 of the present invention may be formed of a linear motor. However, the present invention is not limited to the actuator or the linear motor. Any devices that can horizontally move the wafer guide 20 in the vacuum chamber 30 can be employed as the wafer-transfer device 30.

The deposition apparatus of the present invention has a deposition barrier 50 formed between the deposition boat 10 and the wafer-transfer device 30 to prevent the vaporized deposition material from being deposited on the wafer-transfer device 30. As shown in FIGS. 3A and 3B, the deposition barrier 50 is vertically formed on the deposition chamber 40, traversing the bottom of the deposition chamber 40 to connect opposing inner walls of the deposition chamber 40. That is, the deposition barrier 50 divides an inner space of the deposition chamber 40 into two sections. The deposition barrier 50 may be installed in parallel with a moving direction of the wafer guide 20. The deposition barrier 50 may be formed of a material identical to that of a portion of the deposition chamber 40 and integrally formed with the portion. By the deposition barrier 50 formed between the wafer-transfer device 30 and the deposition boat 10, the wafer-transfer device 30 is not exposed to the vaporized deposition material. As a result, the vaporized deposition material is not deposited on the wafer-transfer device 30, preventing the apparatus 30 from malfunctioning.

As there is provided the deposition barrier 50 between the deposition boat 10 and the deposition barrier 50, as shown in FIG. 6, the wafer guide member 23 connecting the wafer guide 20 to the wafer-transfer device 30 is bent at a predetermined angle. That is, the wafer guide support 23 has a first end fixed on the wafer guide 20 and a second end fixed on the wafer-transfer device 30 over the deposition barrier 50.

Figure 7:
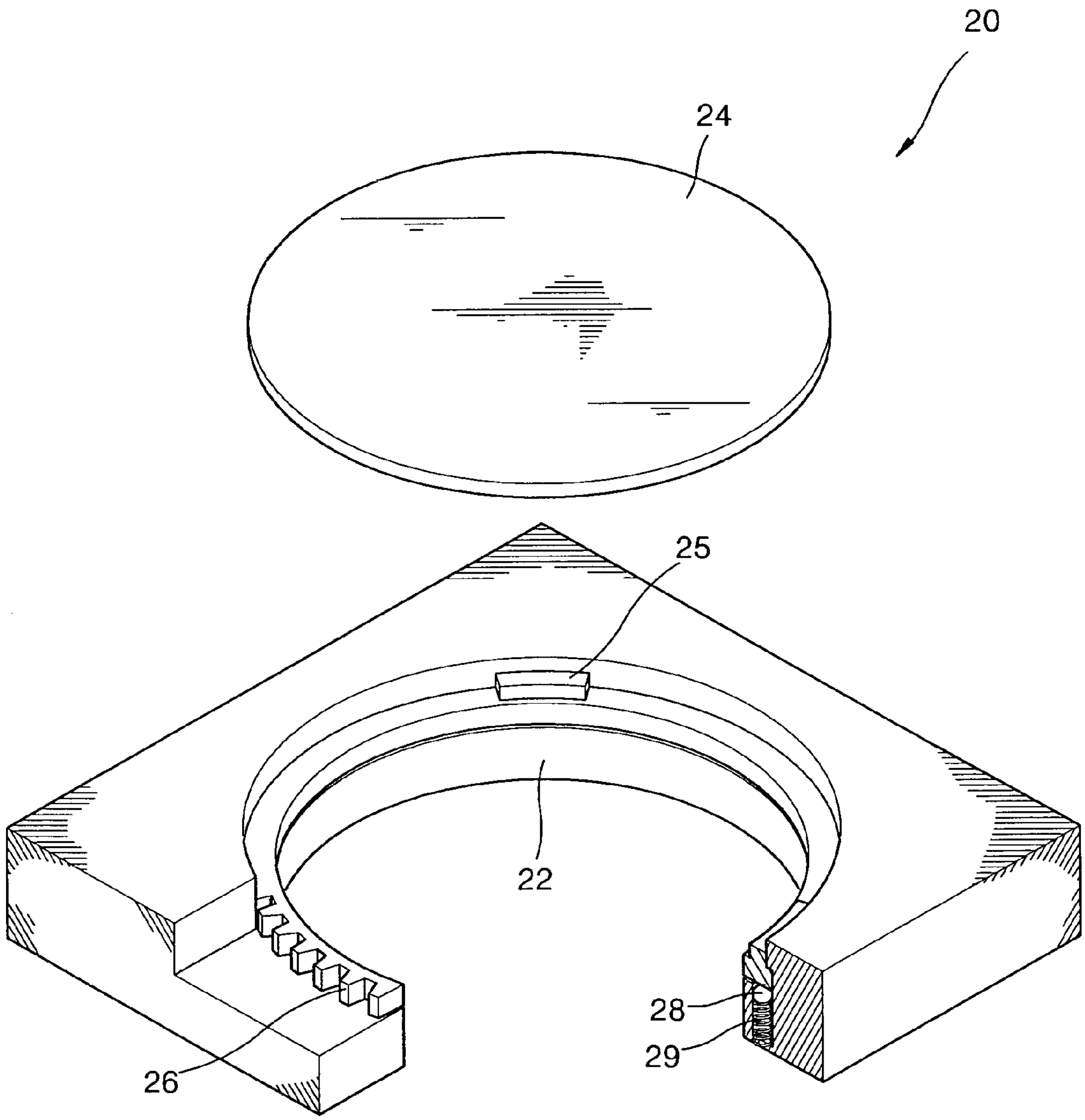
FIG. 7 is a view of a wafer guide according to an embodiment of the present invention.
Figure 8A:
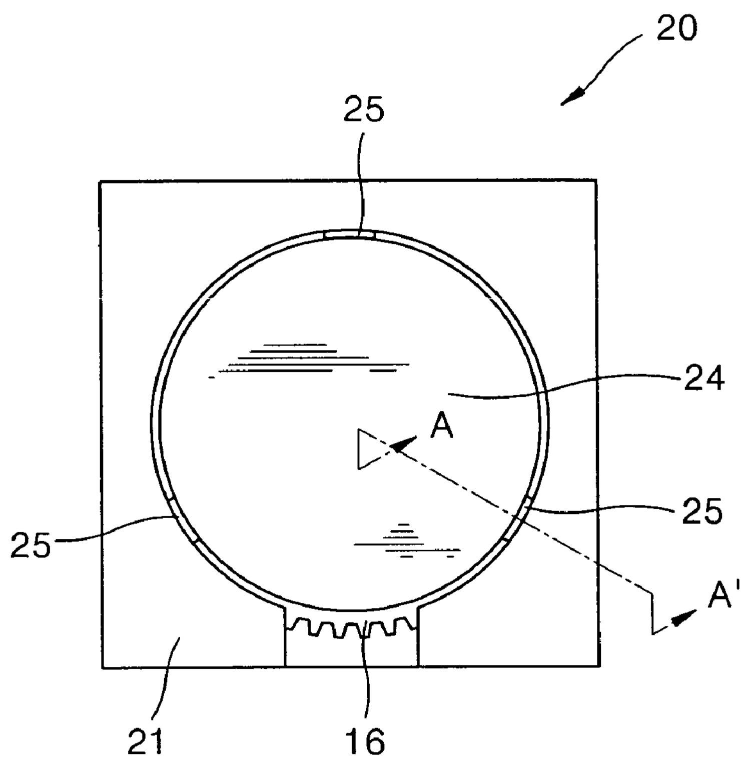
FIGS. 8A and 8B are plane and partial sectional views of a wafer guide according to an embodiment of the present invention.
Figure 8B:
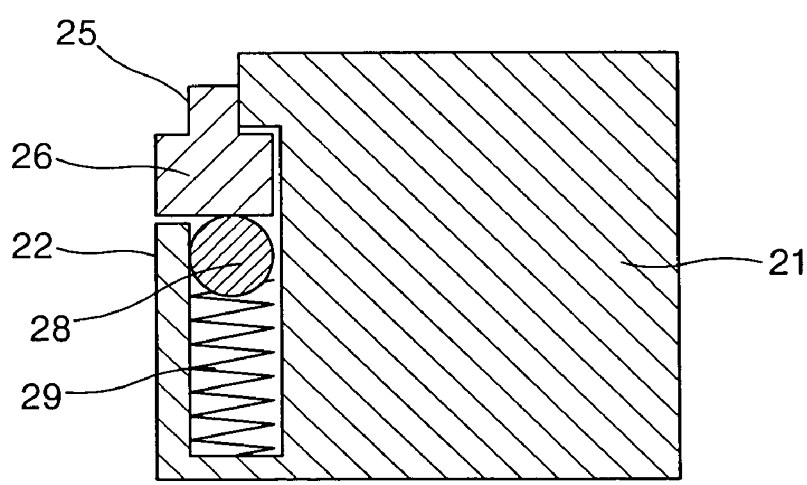

FIGS. 7, 8A and 8B are detailed views of the wafer guide 20. That is, FIG. 7 is a perspective view of the wafer guide 20, FIG. 8A is a plane view of the wafer guide 20, and FIG. 8B a sectional view taken along line A–A' of FIG. 8A.

As shown in the drawings, the wafer guide 20 comprises a housing 21, a rotational member 26 rotating together with the wafer 24 loaded thereon, the rotational member 26 being provided with a circular opening, balls 28 supporting the rotation of the rotational member 26, absorbing springs 29 functioning as an absorber, and wafer support projections 25 formed on an outer edge of the rotational member 26.

The housing 21 is provided with a central opening through which the vaporized deposition material passes to be deposited on the lower surface of the wafer 24. A circumferential groove in which the rotational member 26 is inserted is formed on an inner circumference of the opening of the housing 21. The rotational member 26 has an outer diameter greater than that of the opening of the housing 21. Here, as shown in FIGS. 7, 8A and 8B, a lower diameter of the opening of the housing is less than an upper diameter of the opening so that the wafer 24 can be easily loaded on the rotational member 26 and the deposition material is not deposited on a bottom of the rotational member 26. Accordingly, an inner diameter of the rotational member 26 must be less than the upper diameter of the opening and identical to the lower diameter so that the wafer 24 can be easily loaded.

When the wafer guide 20 horizontally moves to reach a wafer-rotation device 60 that will be described later, the rotational member 26 is engaged with the wafer-rotation device 60 to rotate together with the wafer 24. Accordingly, at least a portion of the rotational member 26 is, as shown in FIGS. 7 and 8A, exposed to an external side to be engaged with the wafer-rotation device 60. That is, a portion of the upper-front of the housing 21, which opposes the wafer-rotation device 60 is cut away. At this point, the cut-away portion must not extend to the bottom of the housing 21 so as for the rotational member 26 not to be exposed to the vaporized deposition material.

The outer circumference of the rotational member 26 is designed to be engaged with the wafer-rotation device 60. That is, the outer circumference of the rotational member 26 is provided with, for example, a saw tooth gear. However, the present invention is not limited to this case. Any structures that can be engaged with the wafer-rotation device 60 will be possible for the present invention.

Meanwhile, the wafer support projections 25 are circumferentially formed extending from the rotational member 26. The wafer support projections 25 function to support the wafer 24 so that, when the rotational member 26 rotates, the wafer 24 disposed on the rotational member 26 can rotate together with the rotational member 26 without being swayed. Accordingly, the wafer support projections 25 are formed spacing away from a central axis of the rotational member 26, the spacing distance corresponding to a radius of the wafer 24 so that an outer circumference of the wafer closely contacts the wafer support projections 25. At this point, the inner walls of the wafer support projections 25 may be designed having a curvature identical to that of the wafer 24. In the drawings, although a plurality of wafer support projections 25 spaced from each other at a predetermined distance are shown, the present invention is not limited to this case. Alternatively, a single circular projection may be formed along an outer edge of the rotational member 26.

An absorber for absorbing vibration of the rotational member 26 while aiding the rotation is installed in the housing 21 under the rotational member 26. That is, the absorber is provided to allow the rotational member 26 to effectively rotate even when a surface of the rotational member 26 becomes uneven due to the adhering of the deposition material. Therefore, the absorber comprises the absorbing springs 29 and the balls 28 that are inserted into holes formed through a bottom of the circumferential groove formed along the inner circumference of the housing 21.

FIG. 8B shows a sectional view taken along line A–A' of FIG. 8A.

Referring to FIG. 8B, the left side is an inner space of the housing 21 and the right side is an external side of the housing 21. The rotational member 26 is inserted in the circumferential groove formed on the inner circumference 22 of the housing 21. The holes are formed on the bottom of the groove to receive the absorbing springs 29 and the balls 28. As described above, the lower diameter of the circular opening of the housing 21 may be identical to an inner diameter of the rotational member 26. If the lower diameter of the circular opening of the housing 21 is greater than the inner diameter of the rotational member 26, a portion of the bottom of the rotational member 26 may be exposed to the deposition material vaporized in the deposition boat 10. As a result, the deposition material may be deposited on the rotational member 26, deteriorating the rotational efficiency and shortening the service life. On the contrary, if the lower diameter of the circular opening of the housing 21 is less than the inner diameter of the rotational member 26, a portion of the wafer 24 may be screened such that the wafer 24 is not completely deposited.

Figure 9:
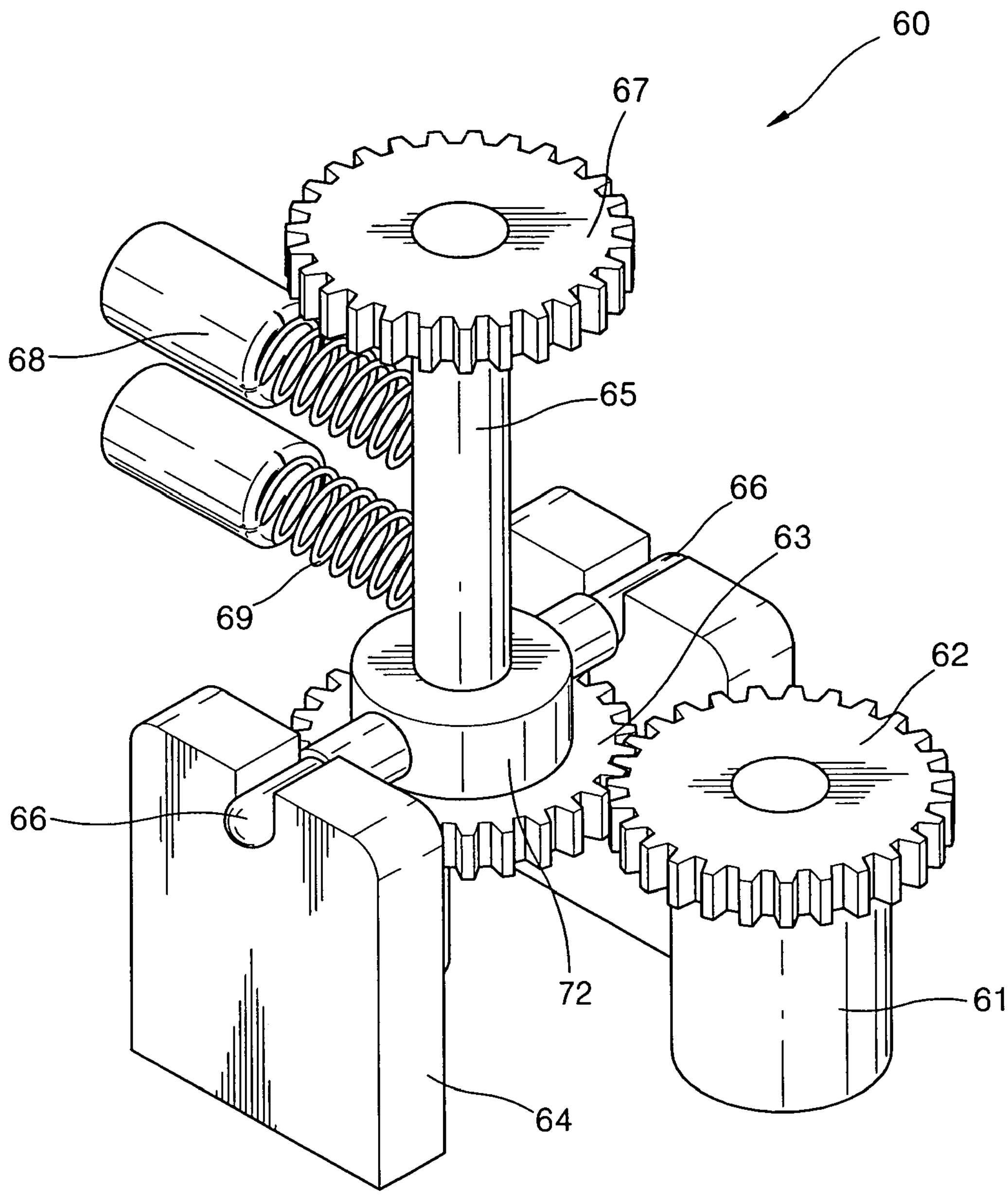
FIG. 9 is a view of a wafer-rotation device according to an embodiment of the present invention.

The wafer-rotation device 60 will be described hereinafter with reference to FIG. 9.

The wafer-rotation device 60 functions to rotate the wafer 24 by 90° so as to allow the wafer 24 that is firstly deposited to be further uniformly deposited while passing over the deposition boat 10. That is, as shown in FIG. 9, the wafer-rotation device 60 comprises a driver unit engaging with the rotational member 26 of the wafer guide 20 to rotate the wafer 24 and a docking absorber for attenuating impact incurred when the driver unit is engaged with the rotational member 26.

The driver unit is connected to a driving device (not shown) on a bottom of the vacuum chamber 40. The driver unit comprises a driving shaft 61 vertically installed on the bottom of the vacuum chamber 40, a driving gear 62 formed around the driving shaft 61 to rotate together with the driving shaft 61, a first driven gear 63 engaged with the driving gear 62 to rotate together with the driving gear 62, a driven shaft 65 engaged with the first driven gear 63, the driven shaft 65 having a lower end passing over a center of the first driven gear 63 and extending near the bottom of the vacuum chamber 40, and a second driven gear 67 coupled to an upper end of the driven shaft 65 and engaged with the rotational member 26 to rotate together with the rotational member 26.

The docking absorber comprises a driven shaft support ring 72 inserted around the driven shaft 65 between the first and second driven gears 63 and 67, two absorbing shafts 66 formed around the driven shaft support ring 72 to be symmetrical in a vertical direction with respect to the driven shaft 65, an absorbing shaft supports 64 rotatably supporting the absorbing shafts 66 so that, when it is docked with the wafer guide 20, the driven shaft 65 rotates toward the inner wall of the vacuum chamber 40 based on the absorbing shafts 66, docking absorbing springs 69 fixed between the inner wall of the vacuum chamber 40 and the driven shaft 65 to bias the driven shaft 65 rotated toward the inner wall of the vacuum chamber 40 to the initial position, and spring supports 68 formed on the inner wall of the vacuum chamber 40 to support the docking absorbing springs 69.

The driven shaft 65 is designed to rotate around its axis as well as to rotate around absorbing shafts 66. At this point, the driven shaft support ring 72 inserted around the driven shaft 65 is designed to rotate and vertically moves based on the absorbing shaft 66 but not to rotate based on the driven shaft 65.

Figure 10:
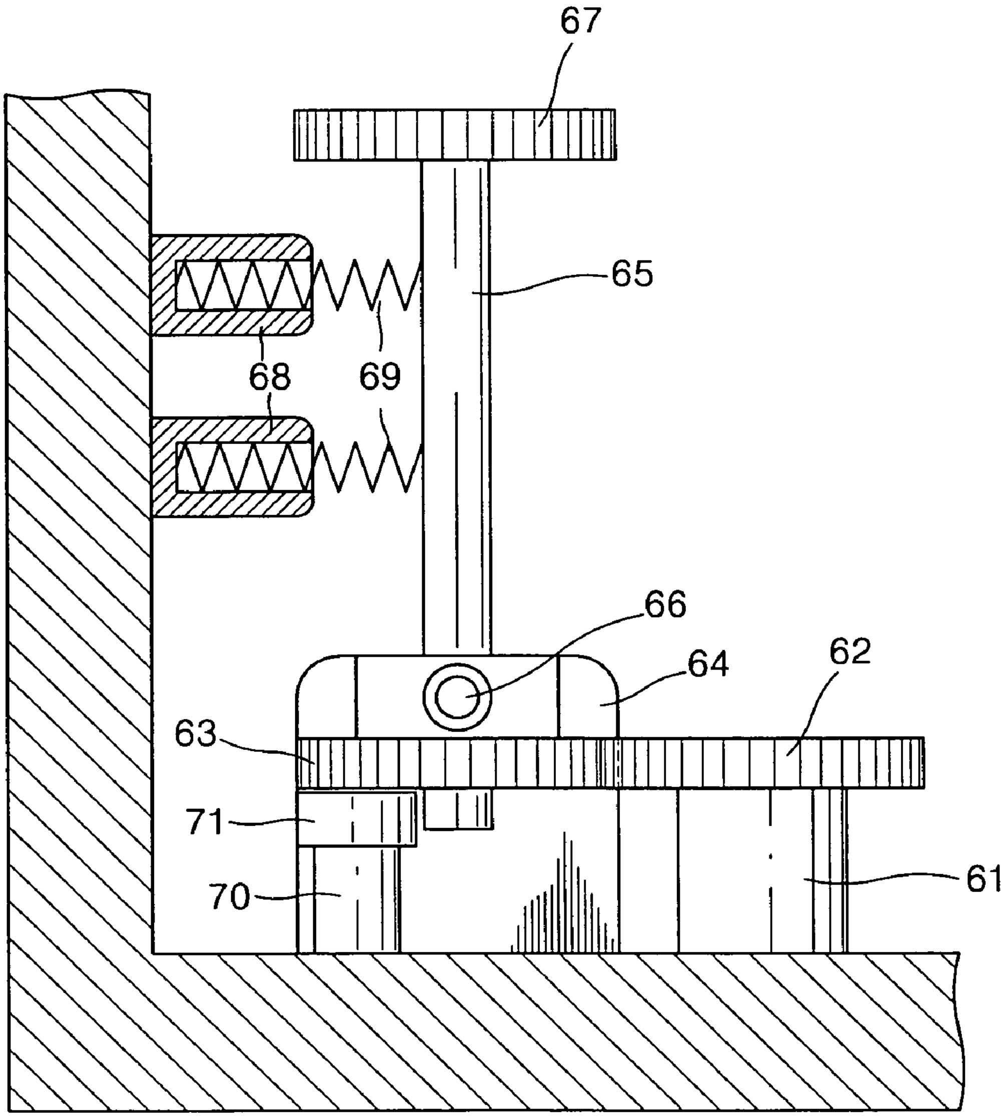
FIG. 10 is a sectional view of a wafer-rotation device and a driven shaft support according to an embodiment of the present invention.

At this point, in order to prevent the driven shaft 65 from falling down toward a center of the vacuum chamber 40, as shown in FIG. 10, there is provided a driven shaft support 70 partly contacting a lower end of the driven shaft 65 at an opposite side of the driving shaft 61 based on the driven shaft 65. Here, a rotational roller 71 may be installed on a portion of the driven shaft support 70, which contacts the driven shaft 65, to minimize frictional force.

The operation of the above-described deposition apparatus of the present invention will be described more in detail hereinafter.

Referring first to FIG. 3A, the wafer guide 20 is located on an inlet 45 of the vacuum chamber 40. The wafer 24 is introduced into the vacuum chamber 40 through the inlet 45 and loaded on the rotational member 26 of the wafer guide 20. When the wafer 24 is loaded on the rotational member 26, current is applied to the main body 12 of the deposition boat 10 to generate Joule-heat. As a result, the deposition material in the deposition boat is vaporized to pass through the slots 16.

At this point, the wafer-transfer device 30 is operated to allow the wafer guide 20 to horizontally pass above the deposition boat 10 as shown in FIG. 3B. At this point, since there is the deposition barrier 50 formed between the wafer-transfer device 30 and the deposition boat 10, the vaporized deposition material does not affect the wafer-transfer device 30. As the wafer guide 20 passes above the deposition boat 10, the vaporized deposition material is deposited on the lower surface of the wafer 24.

As shown in FIG. 3C, when the wafer-transfer device 30 further moves the wafer guide 20 to the wafer-rotation device 60 such that the wafer guide 20 contacts the wafer-rotation device 60, the second driven gear 67 of the wafer-rotation device 60 is engaged with the rotational member 26 of the wafer guide 20 and the operation of the wafer-transfer device 30 is stopped. At this point, the driven shaft 65 of the wafer-rotation device 60 is slightly forced toward the inner wall of the vacuum chamber 40 and is then returned due to docking impact. As a result, the saw tooth portions of the second driven gear 67 and the rotational member 26 are smoothly engaged with each other without being damaged. When the rotational member 26 is accurately engaged with the second driven gear 67, the driving device disposed on the bottom of the vacuum chamber 40 is operated to rotate the driving gear 62. The rotation of the driving gear 62 is transmitted to the rotational member 26 through the first driven gear 63, the driven shaft 65, and the second driven gear 67 to thereby rotate the wafer 24 loaded on the rotational member 26. The rotational angle may be 90°. However, the present invention is not limited to this angle.

When the wafer is rotated at a desired angle, the wafer-transfer device 30 is operated again to move the wafer guide 20 to the inlet 45 of the vacuum chamber 40. At this point, the rotated wafer 24 passes again above the deposition boat 10, the deposition material may be further uniformly deposited on the bottom of the wafer 24. When the wafer guide 20 reaches the inlet 45, the wafer 24 is unloaded and a new wafer is loaded.

As described above, in the present invention, since the deposition apparatus is designed having a simple structure, a variety of malfunction causes may be eliminated and the maintenance is easy. Accordingly, the deposition process can be effectively realized, reducing the defective rate and saving the deposition time.

Furthermore, since the wafer guide of the present invention is designed to rotate together with the rotational member, the separation of the wafer from the wafer guide can be prevented. Therefore, there is no need for separation detecting sensors, simplifying the structure of the deposition apparatus. In addition, the defective caused by the separation of the wafer from the rotational member can be reduced.

In addition, there is provided the deposition barrier in the vacuum chamber, preventing the deposition material from being deposited on the wafer-transfer device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A deposition apparatus comprising:

a deposition boat installed in the vacuum chamber to vaporize the deposition material;

a wafer guide having a rotational member which is rotated together with the wafer;

a wafer-rotation device rotating the rotational member when the wafer guide approaches, wherein the vapor deposition boat is installed at a first position that defines a vapor deposition zone at the first position, the wafer-rotation device being installed at a second position that is laterally separated from the first position and outside the vapor deposition zone such that the wafer rotation device is adapted to rotate the rotational member while the rotational member is outside the vapor deposition zone; and a wafer-transfer device which reciprocates the wafer guide between an inlet of the vacuum chamber and vapor deposition zone and between the vapor deposition zone and the wafer-rotation device via the deposition boat.

2. The deposition apparatus of claim 1, wherein the deposition boat comprises a boat body provided at a center with a concave filling portion for receiving the deposition material and a cover provided with a plurality of slots disposed in parallel with each other.

3. The deposition apparatus of claim 2, wherein a width of each slot is in a range of 1–500 $\mu$m.

4. The deposition apparatus of claim 1, further comprising a deposition barrier formed between the deposition boat and the wafer-transfer device to prevent the deposition material from being deposited on the wafer-transfer device.

5. The deposition apparatus of claim 4, wherein the deposition barrier is formed in parallel to a direction where the wafer guide moves.

6. The deposition apparatus of claim 1, wherein the wafer-transfer device comprises:

a first driving motor installed on an external side of the vacuum chamber; and a transferring shaft rotated by the first driving motor, the transferring shaft being installed in the vacuum chamber in parallel with a direction where the wafer guide moves.

7. The deposition apparatus of claim 1, wherein the wafer guide comprises:

a housing provided with a central opening;

a circumferential groove formed on an inner circumference of the central opening to receive the rotational member;

an absorber for absorbing vibration incurred when the rotational member rotates; and a wafer guide support for fixing the wafer guide on the wafer-transfer device, wherein the rotational member is provided with a circular opening.

8. The deposition apparatus of claim 7, wherein the wafer guide support is bent, having a first end connected to the wafer guide and a second end connected to the wafer-transfer device.

9. The deposition apparatus of claim 8, wherein the second end is connected to the transferring shaft.

10. The deposition apparatus of claim 7, wherein a portion of the housing, which faces the wafer-rotation device, is partly cut away such that the rotational member can be exposed out of the housing, whereby the rotational member can be engaged with the wafer-rotation device when the wafer guide reaches the wafer-rotation device.

11. The deposition apparatus of claim 10, wherein a lower portion of the housing is not cut way so as to prevent the rotational member to be exposed to the vaporized deposition material.

12. The deposition apparatus of claim 7, wherein based on the circumferential groove of the housing, an upper diameter of the opening is greater than a lower diameter of the opening, and an inner diameter of the rotational member is less than the upper diameter of the opening and identical to the lower diameter of the opening.

13. The deposition apparatus of claim 12, wherein the rotational member is provided at an outer circumference with a saw tooth gear.

14. The deposition apparatus of claim 13, wherein the rotational member is provided at a top with a circumferential support projection supporting the wafer.

15. The deposition apparatus of claim 14, wherein the wafer support projection is formed spacing away from a center of the rotational member, the spacing distance corresponding to a radius of the wafer so that an outer circumference of the wafer closely contacts the wafer support projection, and an inner wall of the wafer support projection is designed having a curvature identical to that of the wafer.

16. The deposition apparatus of claim 14, wherein the wafer support projection is plural spaced from each other at a predetermined distance.

17. The deposition apparatus of claim 7, wherein the absorber comprises:

a plurality of holes formed on a bottom of the circumferential groove formed on the inner circumference of the housing;

an absorbing spring inserted in each of the holes; and a ball disposed on the absorbing spring to contact the rotational member.

18. The deposition apparatus of claim 1, wherein the wafer-rotation device comprises:

a driver unit engaging with the rotational member of the wafer guide to rotate the wafer; and a docking absorber for attenuating impact incurred when the driver is engaged with the rotational member.

19. The deposition apparatus of claim 18, wherein the driver unit comprises:

a driving shaft vertically installed on the bottom of the vacuum chamber;

a driving gear formed around the driving shaft to rotate together with the driving shaft;

a first driven gear engaged with the driving gear to rotate together with the driving gear;

a driven shaft engaged with the first driven gear, the driven shaft having a lower end passing over a center of the first driven gear and extending near the bottom of the vacuum chamber; and a second driven gear coupled to an upper end of the driven shaft and engaged with the rotational member to rotate together with the rotational member.

20. The deposition apparatus of claim 19, wherein a lower end of the driven shaft extends near the bottom of the vacuum chamber, passing over a center of the first driven gear.

21. The deposition apparatus of claim 20, wherein a driven shaft support partly contacts a lower end of the driven shaft at an opposite side of the driving shaft based on the driven shaft in order to prevent the driven shaft from falling down toward a center of the vacuum chamber.

22. The deposition apparatus of claim 21, wherein a rotational roller is installed on a portion of the driven shaft support, which contacts the driven shaft, to minimize frictional force.

23. The deposition apparatus of claim 19, wherein the docking absorber comprises:

a driven shaft support ring inserted around the driven shaft between the first and second driven gears;

two absorbing shafts formed around the driven shaft support ring to be symmetrical in a vertical direction with respect to the driven shaft;

absorbing shaft supports rotatably supporting the absorbing shafts;

docking absorbing springs fixed between the inner wall of the vacuum chamber and the driven shaft to bias the driven shaft rotated toward the inner wall of the vacuum chamber to an initial position; and spring supports formed on the inner wall of the vacuum chamber to support the docking absorbing springs.

* * * * *